(12) United States Patent
Nishikawa

(10) Patent No.: US 7,719,661 B2
(45) Date of Patent: May 18, 2010

(54) ILLUMINATION OPTICAL APPARATUS, EXPOSURE APPARATUS, AND METHOD FOR PRODUCING DEVICE

(75) Inventor: Jin Nishikawa, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/292,381

(22) Filed: Nov. 18, 2008

(65) Prior Publication Data

US 2009/0135386 A1 May 28, 2009

Related U.S. Application Data

(60) Provisional application No. 60/996,614, filed on Nov. 27, 2007.

(51) Int. Cl.
G03B 27/54 (2006.01)
G03B 27/52 (2006.01)

(52) U.S. Cl. .......................................... 355/67; 355/30

(58) Field of Classification Search ................... 355/52, 355/53, 55, 67–71; 359/620–626
See application file for complete search history.

(56) References Cited

U.S. PATENT DOCUMENTS

| | | | |
|---|---|---|---|
| 6,452,661 B1 | 9/2002 | Komatsuda | |
| 6,833,904 B1 * | 12/2004 | Komatsuda | 355/67 |
| 7,247,866 B2 | 7/2007 | Bakker et al. | |
| 7,446,856 B2 * | 11/2008 | Komatsuda | 355/67 |
| 2001/0038442 A1 | 11/2001 | Hansell et al. | |
| 2004/0013226 A1 | 1/2004 | Bakket et al. | |
| 2004/0227920 A1 | 11/2004 | Hara | |
| 2006/0164622 A1 | 7/2006 | Hara | |
| 2008/0088814 A1 * | 4/2008 | Kajiyama et al. | 355/71 |

FOREIGN PATENT DOCUMENTS

| | | |
|---|---|---|
| EP | 1 211 918 A1 | 6/2002 |
| EP | 1 349 008 A1 | 10/2003 |
| EP | 1 441 257 A2 | 7/2004 |
| JP | A-11-345761 | 12/1999 |
| JP | A-2004-152843 | 5/2004 |
| WO | WO 02/27400 A2 | 4/2002 |
| WO | WO 2005/083759 A1 | 9/2005 |

OTHER PUBLICATIONS

U.S. Appl. No. 60/935,375, filed Aug. 9, 2007.
U.S. Appl. No. 12/170,933, filed Jul. 10, 2008.
U.S. Appl. No. 60/935,377, filed Aug. 9, 2007.
U.S. Appl. No. 12/170,236, filed Jul. 9, 2008.

* cited by examiner

*Primary Examiner*—Hung Henry Nguyen
(74) *Attorney, Agent, or Firm*—Oliff & Berridge, PLC

(57) ABSTRACT

An illumination optical apparatus which illuminates an illumination objective surface with an exposure light includes: an illumination optical system having a curved mirror and a concave mirror and defining a position substantially conjugate with the illumination objective surface between the curved and concave mirrors; and a second aperture plate separating a space in which the curved mirror is arranged and a space in which the concave mirror is arranged into mutually different vacuum environments or pressure-reduced environments, and having an aperture through which the exposure light passes, the aperture being arranged at a position at which a cross-sectional area of the exposure light is smallest, or in the vicinity of the position. It is possible to decrease the amount of passage of minute particles such as debris in relation to any downstream-side optical system.

18 Claims, 6 Drawing Sheets

ILLUMINATION OPTICAL APPARATUS, EXPOSURE APPARATUS, AND METHOD FOR PRODUCING DEVICE

CROSS-REFERENCES TO RELATED APPLICATIONS

This application claims the benefit of priority of U.S. Provisional Application No. 60/996,614 filed on Nov. 27, 2007, the entire disclosures of which are incorporated herein by reference.

BACKGROUND OF THE INVENTION

1. Field of the Invention

The present invention relates to an illumination optical apparatus of the reflection type which guides an illumination light to a surface of an illumination objective (illumination objective surface), an exposure apparatus provided with the illumination optical apparatus, and a method for producing a device using the exposure apparatus.

2. Description of the Related Art

Recently, in order to enhance the resolution by shortening the exposure wavelength, an exposure apparatus (hereinafter referred to as "EUV exposure apparatus") has been developed, which exposes a substrate such as a wafer via a reticle (mask) by using, as an exposure light beam (exposure light), an extreme ultraviolet light (hereinafter referred to as "EUV light") which has a wavelength of, for example, not more than about 100 nm. In the EUV exposure apparatus, there is no optical member through which the EUV light is transmitted. Therefore, an illumination optical system, a projection optical system, etc. are constructed by using reflecting optical members, except for specified optical filters or the like. The reticle is also formed of a material of the reflection type.

The EUV light is absorbed by a gas. Therefore, the EUV exposure apparatus is installed in a vacuum chamber in which a vacuum atmosphere having an air pressure considerably lower than the atmospheric pressure is maintained (see, for example, Japanese Patent Application Laid-open No. 2004-152843). Further, as for a light source section, which includes a laser plasma light source, etc., is sometimes provided in a small-sized independent vacuum chamber in order to further enhance the degree of vacuum.

SUMMARY OF THE INVENTION

In relation to the EUV exposure apparatus, the following fact is known. That is, when the exposure is continued, then debris (scattered particles), which are generated in the light source section, adhere to the reflecting surface of the reflecting optical member of each of the illumination optical system and the projection optical system, and the reflectance of the reflecting surface is gradually lowered. In view of the above, the illumination optical system, which is arranged at the position near to the light source section, adopts such a structure that the reflecting optical member can be individually exchanged when the reflectance is lowered.

However, as for the projection optical system, it is necessary that an image of a reticle pattern should be projected onto the wafer highly accurately. Therefore, a plurality of reflecting optical members are installed in a barrel while being positioned highly accurately. Therefore, even if the reflectance of one of the reflecting optical members is lowered below an allowable range, it is necessary that the entire projection optical system should be exchanged. Therefore, it is required to decrease the amount of the debris generated in the light source section and arriving at the side of the projection optical system via the illumination optical system, so that the debris are not adhered to the reflecting surface of the reflecting optical member of the projection optical system.

Taking the foregoing circumstances into consideration, an object of the present invention is to provide a reflection type illumination technique which makes it possible to decrease the amount of the minute particles such as the debris adhering to the reflecting surface, an exposure technique which uses the illumination technique, and a technique for producing a device which uses the exposure technique.

According to the present invention, there is provided a reflection type illumination optical apparatus which guides an illumination light to an illumination objective surface, the illumination optical apparatus comprising: an optical system including an optical integrator having a plurality of reflecting mirror elements, a first reflecting surface which reflects the illumination light reflected by each of the plurality of reflecting mirror elements, and a second reflecting surface which guides the illumination light reflected by the first reflecting surface to the illumination objective surface, the optical system defining a position conjugate with the illumination objective surface between the optical integrator and the illumination objective surface; and a partition wall member separating a first space in which the first reflecting surface is arranged and a second space in which the second reflecting surface is arranged into mutually different vacuum environments or pressure-reduced environments, the partition wall member having an aperture which is formed in the positional wall member and through which the illumination light passes; wherein the aperture of the partition wall member is arranged at a position at which a cross-sectional area of a light flux of the illumination light reflected by the first reflecting surface is smallest, or the aperture is arranged in the vicinity of the position.

According to the present invention, the partition wall member is arranged at the position at which the cross-sectional area of the light flux of the illumination light reflected by the first reflecting surface is smallest or minimized, or in the vicinity of the position. Thus, the aperture can be small-sized. Therefore, the flow rate of the gas can be decreased between the first space and the second space; the amount of passage (passage amount) of the minute particles is decreased; and it is possible to decrease the adhesion of the minute particles such as the debris which adhered to the reflecting surface of the optical member arranged in the second space.

DESCRIPTION OF THE PREFERRED EMBODIMENTS

An example of embodiment of the present invention will be explained with reference to FIGS. 1 to 3.

Figure 1:
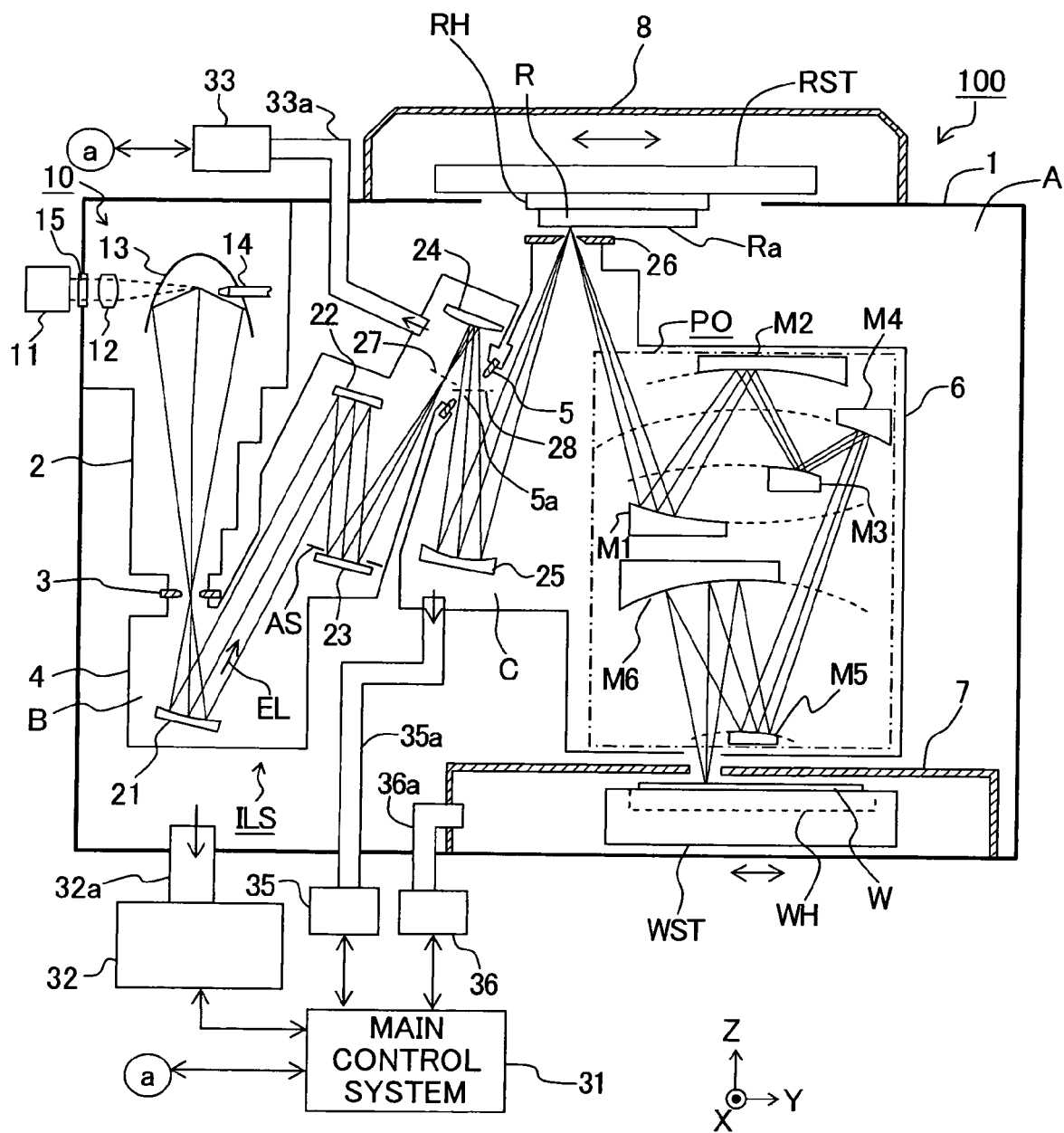
FIG. 1 shows a sectional view of a schematic construction of an exposure apparatus according to an example of embodiment of the present invention.

FIG. 1 is a sectional view schematically illustrating the overall construction of an exposure apparatus (EUV exposure apparatus) 100 of this embodiment using an EUV light, in which the wavelength is within a range of about 3 to 50 nm, for example, 11 nm or 13 nm, etc., as an exposure light EL (exposure light beam or illumination light). With reference to FIG. 1, the exposure apparatus 100 includes a laser plasma light source 10 which emits the exposure light EL; an illumination optical system (optical system) ILS which illuminates a reticle R (mask) with the exposure light EL; a reticle stage RST which moves the reticle R; and a projection optical system PO which projects an image of a pattern formed on a pattern surface (hereinafter referred to as "reticle surface") Ra of the reticle R onto a wafer (photosensitive substrate) W coated with a resist (photosensitive material). The exposure apparatus 100 further includes a wafer stage WST which moves the wafer W; a main control system 31 which includes a computer integrally controlling the operation of the entire apparatus; a vacuum pump; etc.

In this embodiment, the EUV light is used as the exposure light EL. Therefore, the illumination optical system ILS and the projection optical system P0, except for specific filters (not shown), etc., are constructed by a plurality of reflecting optical members. The reticle R is also constructed as the reflection type. Multilayered reflective films, which reflect the EUV light, are formed on the reticle surface Ra (reflecting surface) and the reflecting surfaces of the reflecting optical members. A circuit pattern is formed by an absorbing layer on the reflective film on the reticle surface Ra. In order to avoid the absorption of the exposure light EL by the gas, the substantially entire exposure apparatus 100 is accommodated in a box-shaped vacuum chamber 1. A large-sized vacuum pump 32 is provided in order to vacuum-evacuate a space A in the vacuum chamber 1 via a gas discharge tube 32a. Further, a plurality of subchambers 2, 4, 6 (details will be described later on) are provided in order to further enhance the degree of vacuum on the optical path for the exposure light EL in the vacuum chamber 1.

The following description will be made with reference to FIG. 1 assuming that the Z axis extends in a direction of the normal line of the guide surface on which the wafer stage WST is moved (bottom surface of the vacuum chamber 1), the X axis extends perpendicularly to the sheet surface of FIG. 1 in a plane perpendicular to the Z axis, and the Y axis extends in parallel to the sheet surface of FIG. 1. In this embodiment, an illumination area of the exposure light EL on the reticle surface Ra has a circular arc-shaped form which is long in the X direction. The reticle R and the wafer W are scanned synchronously in the Y direction with respect to the projection optical system PO during the exposure.

The laser plasma light source 10 is a light source of the gas jet cluster system including a high output laser light source 11, a light-collecting lens 12 which collects the laser beam from the laser light source 11 via a window member 15 of the vacuum chamber 1, a nozzle 14 which jets a target gas such as xenon or krypton, and a light-collecting mirror (elliptic reflecting mirror) 13 which has an elliptic reflecting surface. The exposure light EL radiated from the laser plasma light source 10 is collected or focused on the second focal point of the light-collecting mirror 13. The exposure light EL focused on the second focal point is converted into a substantially parallel light flux via a concave mirror (collimator optical system) 21; and the exposure light EL is guided to an optical integrator constructed of a pair of fly's eye optical systems 22, 23.

Figure 2A:
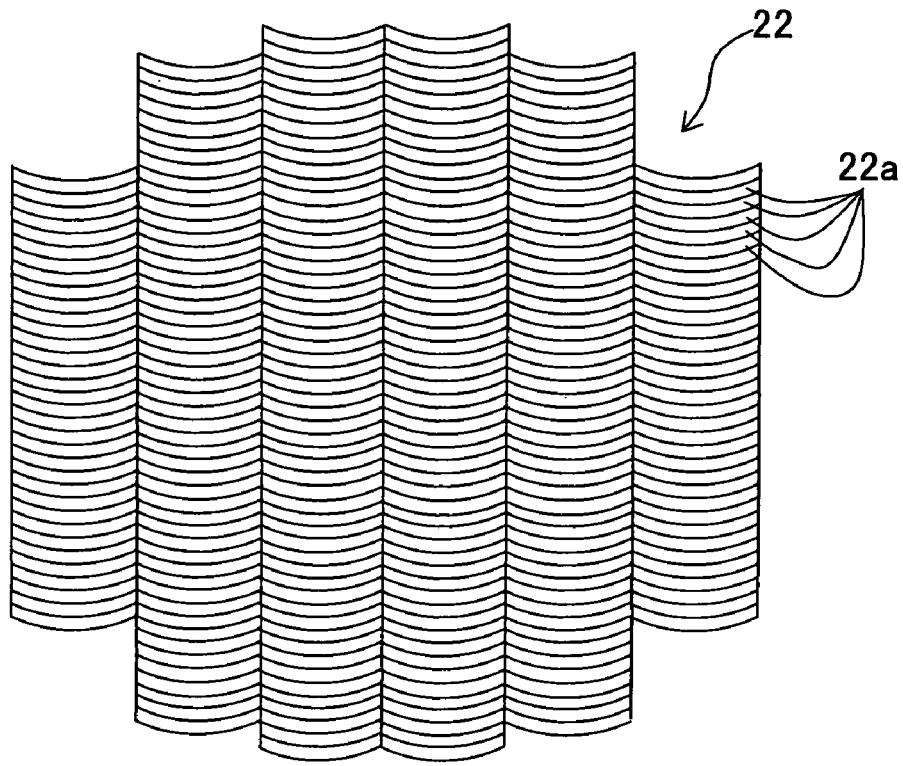
FIG. 2A shows a first fly's eye optical system 22 shown in FIG. 1.
Figure 2B:
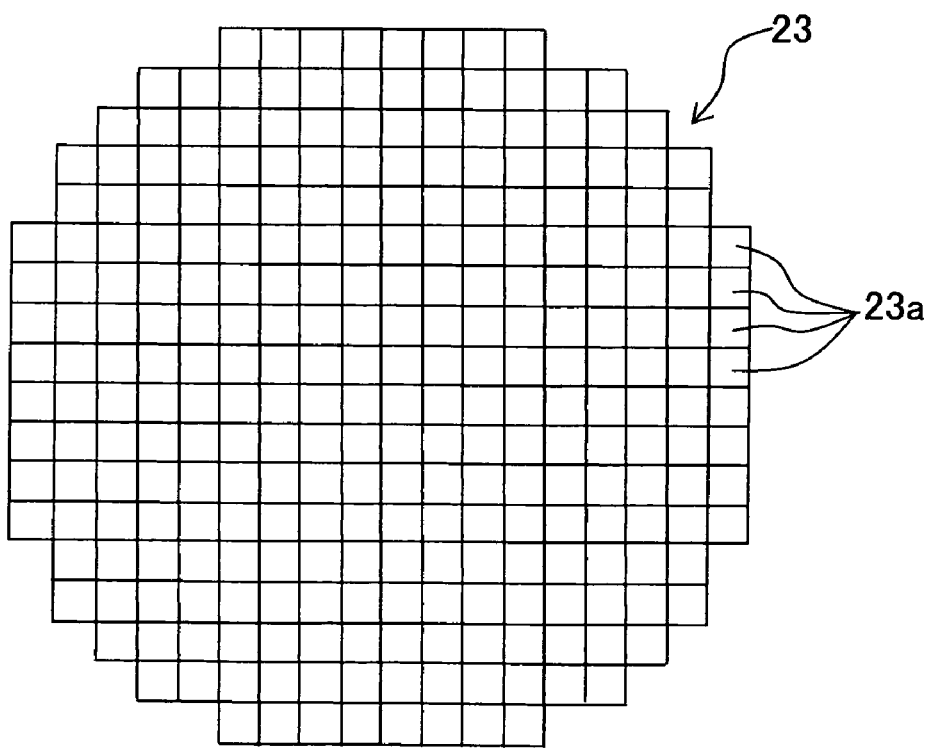
FIG. 2B shows a second fly's eye optical system 23 shown in FIG. 1.

As an example, as shown in FIG. 2A, the first fly's eye optical system 22 is constructed of a large number of reflecting mirror elements 22a each of which has a circular arc-shaped outer shape and which are arranged two-dimensionally. As shown in FIG. 2(B), the second fly's eye optical system 23 is constructed of a large number of reflecting mirror elements 23a each of which has a rectangular outer shape and which are arranged two-dimensionally, corresponding to the large number of reflecting mirror elements 22a of the first fly's eye optical system 22. The construction and the function of the fly's eye optical systems 22, 23 are more specifically disclosed, for example, in U.S. Pat. No. 6,452,661. The contents of U.S. Pat. No. 6,452,661 are incorporated herein by reference within a range of permission of the domestic laws and ordinances of the designated state or the selected state.

With reference to FIG. 1, a substantial surface light source, which has a predetermined shape, is formed in the vicinity of the reflecting surface of the second fly's eye optical system 23 (in the vicinity of the light-exit surface of the optical integrator). That is, the plane, on which the substantial surface light source is formed, is the pupil plane of the illumination optical system ILS. An aperture diaphragm AS is arranged at the position of the pupil plane or in the vicinity of the pupil plane. The aperture diaphragm AS representatively illustrates a plurality of aperture diaphragms having apertures of various shapes. By exchanging the aperture diaphragm AS under the control of the main control system 31, it is possible to switch the illumination condition into the ordinary illumination, the zonal or annular illumination, the dipole illumination, the quadruple illumination, or the like.

The exposure light EL, which is allowed to pass through the aperture diaphragm AS, is once focused or collected, and then the exposure light EL is allowed to come into a curved mirror 24. The exposure light EL reflected by the curved mirror 24 is reflected by a concave mirror 25, and then the exposure light EL is allowed to pass through an aperture of a field diaphragm 26 to illuminate a circular arc-shaped illumination area of the reticle surface Ra obliquely from the lower position at a uniform illuminance distribution. A condenser optical system is constructed by the curved mirror 24 and the concave mirror 25. Owing to the condenser optical system, the light (light beam), from the large number of reflecting mirror elements of the second fly's eye optical system 23, illuminates the illumination area of the reticle surface Ra in a superimposed manner. In the exemplary construction shown in FIG. 1, the curved mirror 24 is a convex mirror. However, the curved mirror 24 may be constructed of a concave mirror, and the curvature of the concave mirror 25 may be decreased to an extent corresponding thereto. The illumination optical system ILS is constructed to include the concave mirror 21, the fly's eye optical systems 22, 23, the aperture diaphragm AS, the curved mirror 24, and the concave mirror 25.

In the illumination optical system ILS of this embodiment, the condenser optical system defines a position which is optically conjugate with the reticle R in the optical path between the second fly's eye optical system 23 and the reticle R, in other words, in the optical path between the second fly's eye optical system 23 and the curved mirror 25. That is, the condenser optical system functions as an imaging optical system which forms, at the conjugate position, an inverted image of the illumination area for illuminating the surface of the reticle R. The reflecting optical member (concave mirror 25), which is closest to the reticle R among the reflecting optical members constructing the illumination optical system ILS (the concave mirror 21, the pair of fly's eye optical systems 22, 23, the curved mirror 24, and the concave mirror 25), has a reflecting surface which is formed to be concave.

In this embodiment, a position, at which the exposure light EL is once focused or collected on the optical path directed from the second fly's eye optical system 23 to the curved mirror 24, is a conjugate plane (hereinafter referred to as "reticle conjugate plane") 27 with respect to the reticle surface Ra. The reticle conjugate plane 27 can be also formed on the optical path directed from the curved mirror 24 to the concave mirror 25, for example, by allowing the curved mirror 24 to approach to the second fly's eye optical system 23. Although the field diaphragm 26 is arranged in the vicinity of the reticle surface Ra, it is also possible to arrange the field diaphragm 26 on the reticle conjugate plane 27.

A plane 28, which is conjugate with the pupil plane of the illumination optical system ILS, is formed or defined on the optical path between the curved mirror 24 and the concave mirror 25. In this embodiment, the position (conjugate plane 28), which is conjugate with the pupil plane of the illumination optical system ILS and which is formed or defined between the curved mirror 24 and the concave mirror 25, can be regarded as the position at which the cross-sectional area is smallest or minimized in relation to the light flux of the exposure light EL reflected by the curved mirror 24. In FIG. 1, the entire light flux of the exposure light EL is depicted. Therefore, the conjugate plane 28 is seemingly positioned at an intermediate position of the diffusing or diverging light flux. Actually, the reflected light beams, from the respective reflecting mirror elements 23a (see FIG. 2B) of the fly's eye optical system 23 forming the surface light source, are reflected by the curved mirror 24, and then are converged on the conjugate plane 28 at which the cross-sectional areas of the respective reflected light beams are smallest.

As for the more specific construction and function of the illumination optical system ILS, reference may be made to the contents disclosed in U.S. Provisional Application Ser. No. 60/935,375 (filed on Aug. 9, 2007) and the non-provisional application thereof (U.S. patent application Ser. No. 12/170,933 filed on Jul. 10, 2008) and U.S. Provisional Application Ser. No. 60/935,377 (filed on Aug. 9, 2007) and the non-provisional application thereof (U.S. patent application Ser. No. 12/170,236 filed on Jul. 9, 2008).

On the other hand, the reticle R is attracted and held on the bottom surface of the reticle stage RST via an electrostatic chuck RH. The reticle stage RST is driven at a predetermined stroke in the Y direction by a driving system (not shown) along a guide surface, of the outer surface of the vacuum chamber 1, which is parallel to the XY plane based on the control information of the main control system 31 and a measured value obtained by a laser interferometer (not shown). Further, the reticle stage RST is driven in minute amounts in the X direction and the θZ direction (direction of rotation about the Z axis) as well. The reticle R is installed or arranged in the space A surrounded by the vacuum chamber 1 via an opening on the upper surface of the vacuum chamber 1. A partition 8 is provided to cover the reticle stage RST on the side of the vacuum chamber 1. The interior of the partition 8 is maintained at a pressure between the atmospheric pressure and the pressure in the space A by an unillustrated vacuum pump.

The exposure light EL reflected by the reticle surface Ra is allowed to pass through the aperture of the field diaphragm 26, and the exposure light EL is directed to the projection optical system PO. The projection optical system P0 is constructed, as an example, by holding six mirrors M1 to M6 by an unillustrated barrel. The projection optical system P0 is a reflection system which is non-telecentric on the side of the object (reticle R) and which is telecentric on the side of the image (wafer W). The projection magnification is a reduction magnification of ¼-fold or the like. The exposure light EL reflected by the reticle R is projected onto an exposure area on the wafer W via the projection optical system PO, thereby transferring a reduction image of the pattern of the reticle R onto the wafer W. In the projection optical system PO, the exposure light EL from the reticle R is reflected by the mirror M1 in the upward direction (+Z direction), and then is reflected by the mirror M2 in the downward direction, followed by being reflected by the mirror M3 in the upward direction and being reflected by the mirror M4 in the downward direction. Subsequently, the exposure light EL is reflected by the mirror M5 in the upward direction, and then is reflected by the mirror M6 in the downward direction to form the image of the pattern of the reticle R on the wafer W. As an example, the mirrors M1, M2, M4, M6 are concave mirrors, and the remaining mirrors M3, M5 are convex mirrors. The projection optical system PO is not limited to the construction shown in FIG. 1, and the number of the reflecting optical members may be any one other than six, and may be, for example, eight.

On the other hand, the wafer W is attracted and held on the wafer stage WST via an electrostatic chuck WH. The wafer stage WST is arranged on a guide surface arranged along the XY plane. The wafer stage WST is driven at predetermined strokes in the X direction and the Y direction by a driving mechanism (not shown) based on the control information of the main control system 31 and a measured value obtained by a laser interferometer (not shown). If necessary, the wafer stage WST is driven also in the direction of rotation about the Z axis, etc.

Upon subjecting one die (shot area) on the wafer W to the exposure, the exposure light EL is radiated onto the illumination area of the reticle R by the illumination optical system ILS, and the reticle R and the wafer W are synchronously moved (subjected to the synchronous scanning), with respect to the projection optical system PO, in the Y direction at a predetermined velocity ratio in accordance with the reduction magnification of the projection optical system PO. In this way, one die on the wafer W is exposed with the reticle pattern. After that, the wafer stage WST is driven to step-move the wafer W, and then the next die on the wafer W is subjected to the scanning exposure with the pattern of the reticle R. The plurality of dies on the wafer W are successively exposed with the pattern of the reticle R in the step-and-scan manner as described above.

Upon performing the exposure, the wafer W is arranged at the inside of a partition 7 so that the gas generated from the resist on the wafer W does not exert any harmful influence on the mirrors M1 to M6 of the projection optical system PO. An aperture, through which the exposure light EL passes, is formed through the partition 7. The space in the partition 7 is vacuum-evacuated via a gas discharge tube 36a by a vacuum pump 36 under the control of the main control system 31.

Next, an explanation will be made about the subchambers 2, 4, 6 and connecting mechanism therefor in the vacuum chamber 1 of the exposure apparatus 100 of this embodiment.

In the space A defined by the vacuum chamber 1 shown in FIG. 1 therein, those accommodated in the first subchamber 2 are the light-collecting lens 12 of the laser plasma light source 10, the light-collecting mirror 13, and an end portion of the nozzle 14. The first subchamber 2 is vacuum-evacuated by an unillustrated vacuum pump. Further, the concave mirror 21, the fly's eye optical systems 22, 23, and the curved mirror 24 in the illumination optical system ILS are accommodated in the second subchamber 4. The space B, which is defined by the second subchamber 4 therein, is vacuum-evacuated by a vacuum pump 33 via a gas discharge tube 33a. Further, the projection optical system PO and the concave mirror 25 closest to the reticle surface (illumination objective surface) Ra in the illumination optical system ILS are accommodated in the third subchamber 6. The space C, which is defined by the third subchamber 6 therein, is vacuum-evacuated by a vacuum pump 35 via a gas discharge tube 35a. A surface of the third subchamber 6, which is opposite to or facing the reticle R, is covered with the field diaphragm 26. An aperture, through which the exposure light EL passes, is formed through the surface of the third subchamber 6 opposite to the wafer W. In a case that the field diaphragm 26 is provided on the reticle conjugate plane 27, another aperture plate having an aperture may be provided at the position of the field diaphragm 26 shown in FIG. 1. The subchambers 2, 4, 6 in the vacuum chamber 1 may be formed of, for example, molybdenum (Mo) as a highly heat-resistant material or a molybdenum alloy such as chromium-molybdenum steel.

The vacuum pumps 32, 33, 35 are provided with barometers respectively. The main control system 31 controls the vacuum pumps 32, 33, 35 based on measured values obtained by the barometers so that predetermined degrees of vacuum are provided in the space A, the space B, and the space C respectively. For example, the air pressure in the space A in the vacuum chamber 1 is about $10^{-5}$ Pa, the air pressure in the first subchamber 2 is about $10^{-6}$ to $10^{-7}$ Pa, the air pressures in the space B in the second subchamber 4 is about $10^{-6}$ to $10^{-7}$ Pa, and the air pressure in the space C in the third subchamber 6 is about $10^{-5}$ to $10^{-6}$ Pa. That is, the degree of vacuum in the space C is set to be higher than that in the space A, and the degree of vacuum in the space B is set to be further higher than that in the space C. It is not necessarily indispensable that the exposure apparatus 100 and/or the illumination optical system ILS is/are equipped to the vacuum pumps 32, 33, 35. It is also allowable to use a vacuum pump provided in the production site in which the exposure apparatus is provided.

The boundary portion between the first subchamber 2 and the second subchamber 4 is disposed in the vicinity of the second focal point of the light-collecting member 13. A first aperture plate 3, in which an aperture is formed to allow the exposure light EL to pass therethrough in such a state that any shading or eclipse is not brought about, is installed or arranged at the boundary portion. The cross-sectional area of the exposure light EL is smallest at the second focal point. Therefore, the exposure light EL is converged at the boundary portion. As a result, the aperture of the first aperture plate 3 can be small-sized. Therefore, owing to the first aperture plate 3, the amount of the minute particles such as the debris (scattered particles), generated in the laser plasma light source 10 and diffused or scattered into the second subchamber 4, is decreased. Most of the debris or the like, diffused to the second subchamber 4 via the first aperture plate 3, are discharged to the outside of the vacuum chamber 1 together with the gas by the vacuum pump 33 via the gas discharge tube 33a. As a result, a period of time is prolonged until the reflectance of each of the reflecting surfaces of the optical members from the concave mirror 21 to the curved mirror 24 of the illumination optical system ILS is deteriorated, and thus it is possible to reduce the maintenance cost of the illumination optical system ILS.

The boundary portion between the second subchamber 4 and the third subchamber 6, i.e., the portion connecting the second subchamber 4 and the third subchamber 6 is disposed in the vicinity of the plane 28 which is conjugate with the pupil plane of the illumination optical system ILS on the optical path for the exposure light EL between the curved mirror 24 and the concave mirror 25 of the illumination optical system ILS. A second aperture plate 5, in which an aperture 5a is formed to allow the exposure light EL to pass therethrough in such a state that any shading or eclipse is not brought about, is arranged at the boundary portion. It is preferable that the first aperture plate 3 and the second aperture plate 5 are formed of, for example, molybdenum (Mo) that is a highly heat-resistant material or a molybdenum alloy such as chromium-molybdenum steel. Tapered portions are formed around the both surfaces of the apertures of the aperture plates 3, 5 so that inner portions are thinned around the apertures, respectively. Accordingly, it is possible to eliminate the shading or eclipse of the exposure light EL, and it is possible to make the aperture to be small-sized.

Since the cross-sectional area of the exposure light EL is small in the vicinity of the plane 28 in relation to the light flux of the exposure light reflected by the curved mirror 24, the aperture 5a can be small-sized. Therefore, owing to the second aperture plate 5, the ratio of rediffusion of the debris, among the debris generated in the laser plasma light source 10 and allowed to pass through the first aperture plate 3 and diffuse in the second subchamber 4, into the third subchamber 6 is greatly reduced. Most of the debris diffused into the third subchamber 6 via the second aperture plate 5 are discharged to the outside of the vacuum chamber 1 together with the gas by the vacuum pump 35 via the gas discharge tube 35a. Further, with respect to the minute particles other than the debris, the diffusion thereof into the third subchamber 6 is also suppressed. The phrase "vicinity of the position at which the cross-sectional area of the light flux is smallest" means, for example, positions until arrival at 2ϕ provided that ϕ represents the diameter of the light flux at the "position at which the cross-sectional area of the light flux is smallest". By providing such a range, it is possible to decrease the cross-sectional area of the aperture or opening depending on the light flux, and it is possible to suppress the entering or inflow and the exit of the minute particles such as the debris into and from the individual chambers accommodating the reflecting optical elements respectively.

Figure 3A:
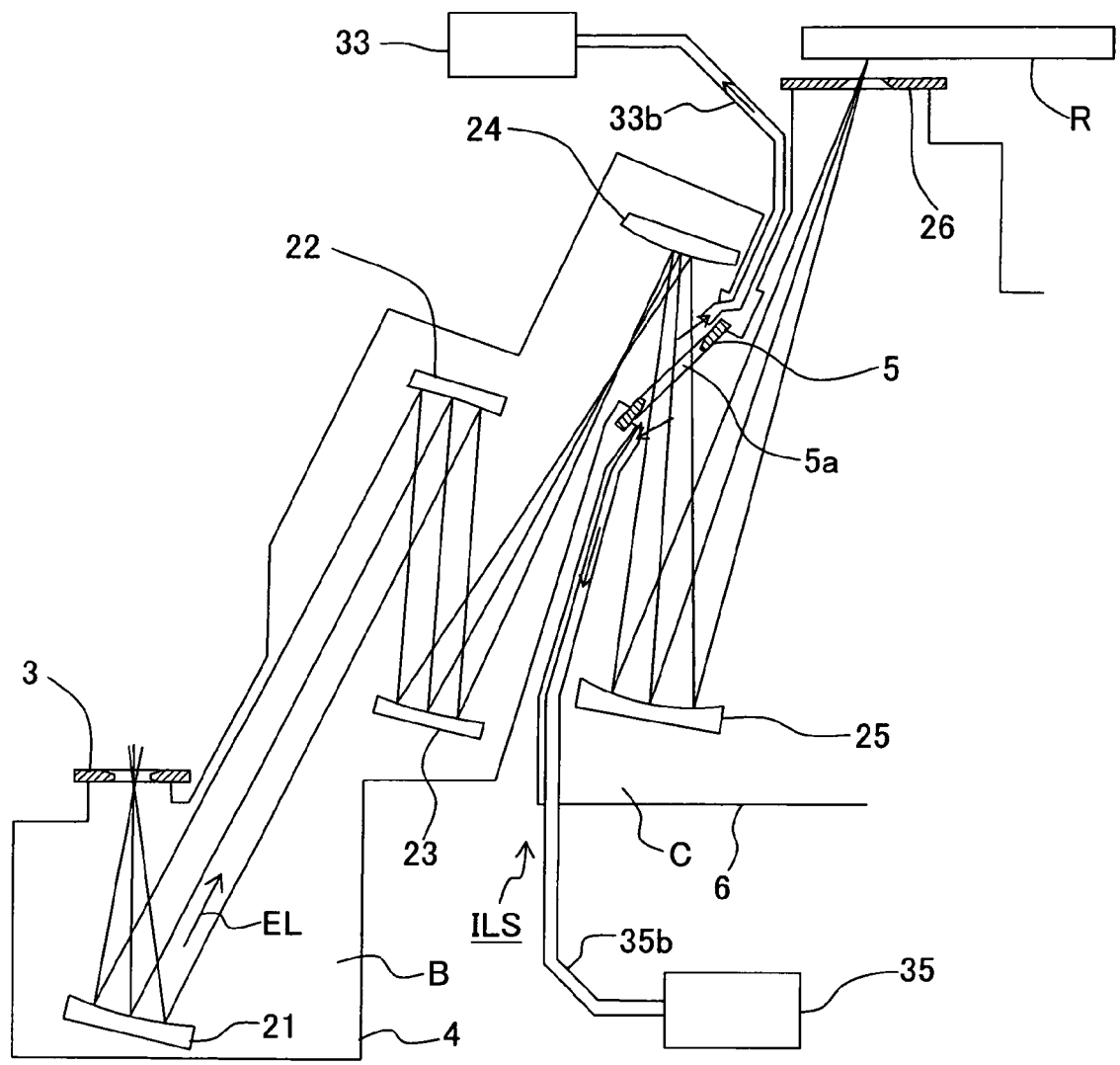
FIG. 3A shows a sectional view of a construction in the vicinity of a second aperture plate 5 shown in FIG. 1.

FIG. 3A shows a sectional view of a part of the second subchamber 4 and a part of the third subchamber 6 shown in FIG. 1. With reference to FIG. 3A, a gas discharge port of a gas discharge tube 33b is arranged in the vicinity of the second aperture plate 5 in the second subchamber 4. The vacuum pump 33 further vacuum-evacuates the space B in the second subchamber 4 via the gas discharge tube 33b. Similarly, a gas discharge port of a gas discharge tube 35b is arranged in the vicinity of the second aperture plate 5 in the third subchamber 6. The vacuum pump 35 further vacuum-evacuates the space C in the third subchamber 6 via the gas discharge tube 33b. As a result, the debris or the like which intend to pass through the aperture 5a of the second aperture plate 5 and the debris or the like which have passed through the aperture 5a are efficiently discharged by the gas discharge tubes 33b, 35b. Therefore, it is possible to further reduce the ratio of the minute particles such as the debris diffusing into the third subchamber 6. As described above, the degree of vacuum of the space B in the second subchamber 4 is set to be higher than the degree of vacuum of the space C in the third subchamber 6. Therefore, the movement of the minute particles such as the debris from the second subchamber 4 into the third subchamber 6 is suppressed.

The function and the effect of this embodiment are as follows.

(1) The illumination optical apparatus of the exposure apparatus 100 shown in FIG. 1 is the reflection type illumination optical apparatus which guides the exposure light EL to the reticle surface Ra (illumination objective surface), and includes the illumination optical system ILS which has the optical integrator (the pair of fly's eye optical systems 22, 23) provided with the plurality of reflecting mirror elements 22a, 23a, the curved mirror (first reflecting surface) 24 reflecting the exposure light EL reflected by each of the plurality of reflecting mirror elements 22a, 23a, and the concave mirror (second reflecting surface) 25 guiding the exposure light EL reflected by the curved mirror 24 to the reticle surface (illumination objective surface) Ra, and which forms or defines the reticle conjugate plane 27 between the optical integrator and the reticle surface Ra; and the second aperture plate (partition wall member) 5 separating the space B in which the curved mirror 24 is arranged and the space C in which the concave mirror 25 is arranged into the mutually different vacuum environments or pressure-reduced environments, the second aperture plate having the aperture 5a which is formed in the second aperture plate and which allows the illumination light EL to pass therethrough. The aperture 5a is arranged to pass across the plane 28 (plane conjugate with the pupil plane of the illumination optical system ILS) as the position at which the cross-sectional area is substantially smallest for the light flux of the exposure light EL reflected by the curved mirror 24 or a position disposed in the vicinity of the position.

Therefore, the second aperture plate 5 makes it possible to decrease the amount of passage of the minute particles such as the debris with respect to the projection optical system P0 which is the optical system disposed on the downstream side of the illumination optical system ILS. Further, since the aperture 5a can be small-sized, it is possible to decrease the flow rate of the gas between the space B and the space C, thereby making it possible to further decrease the amount of passage of the minute particles. As a result, the period of time is extremely prolonged until the reflectance of the concave mirror 25 of the illumination optical system ILS in the space C is deteriorated and the reflectance of each of the reflecting surfaces of the mirrors M1 to M6 of the projection optical system PO in the space C is deteriorated, thereby making it possible to reduce the maintenance cost for the concave mirror 25 and the projection optical system PO. Further, it is possible to maintain the illuminance of the exposure light EL, irradiated from the projection optical system P0 onto the wafer W, to be high.

(2) The illumination optical system ILS includes the concave mirror 21 and the fly's eye optical systems 22, 23 as the plurality of reflecting optical members. The position, at which the cross-sectional area of the light flux of the exposure light EL is substantially smallest on the optical path directed from the curved mirror 24 to the concave mirror 25, is the position of the pupil plane of the illumination optical system ILS or the plane 28 conjugate with the pupil plane. Therefore, for example, when the aperture 5a is arranged on the plane 28 or in the vicinity thereof, the aperture 5a can be further small-sized.

In a case that the reticle conjugate plane 27 is formed on the optical path directed from the curved mirror 24 to the concave mirror 25 depending on the arrangement of the illumination optical system ILS, the cross-sectional area of the exposure light is smallest on the reticle conjugate plane 27. Therefore, the aperture 5a may be arranged at the position of the reticle conjugate plane 27 or in the vicinity of the position.

(3) In a case that the second aperture plate 5 is arranged on the pupil plane of the illumination optical system ILS, the plane 28 conjugate with the pupil plane, or in the vicinity of the planes, it is also possible to use the aperture 5a of the second aperture plate 5 as at least a part of the aperture diaphragm AS of the illumination optical system ILS. For example, with reference to FIG. 1, the outer diameter of the light flux of the exposure light EL as well as the coherence factor (σvalue) can be also defined by the aperture 5a. Accordingly, it is possible to further make the aperture 5a be small-sized, further reducing the diffusion of the minute particles into the third subchamber 6.

(4) The vacuum pumps 33, 35 (gas discharge mechanisms) which discharge a gas from the space B and the space C are provided. As shown in FIG. 3A, the gas discharge ports of the gas discharge tubes 33b, 35b of the vacuum pumps 33, 35 are provided in the vicinity of the second aperture plate 5. Therefore, it is possible to reduce the amount of the minute particles diffused into the space C through the aperture 5a.

Figure 3B:
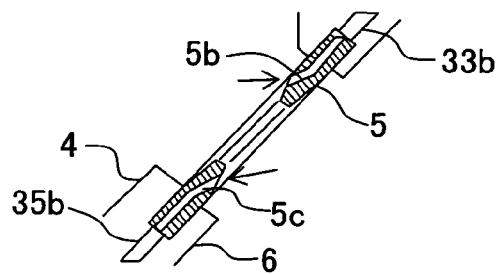
FIG. 3B shows a sectional view of a modified embodiment of the second aperture plate 5 shown in FIG. 3A.

Instead of arranging the gas discharge ports of the gas discharge tubes 33b, 35b directly in the second subchamber 4 and the third subchamber 6 as shown in FIG. 3B respectively, it is allowable that gas discharge holes 5b, 5c are formed in the second aperture plate 5, and that the gas discharge tubes 33b, 35b are connected to the gas discharge holes 5b, 5c. It is also enough to provide only at least one of each of the gas discharge tubes 33b, 35b and at least one of the gas discharge holes 5b, 5c.

However, the minute particles diffusing into the third subchamber 6 through the aperture 5a can be reduced most efficiently by providing the vacuum pump 33 which has the gas discharge port provided on the side of the space B of the second aperture plate 5 and the vacuum pump 35 which has the gas discharge port provided on the side of the space C of the second aperture plate 5.

(5) With reference to FIG. 1, the conjugate plane, which is conjugate with the pupil plane of the illumination optical system ILS, is arranged between the curved mirror 24 and the concave mirror 25. Therefore, in relation to the plurality of reflecting optical members, it is easy to separate the space B in which the concave mirror 21 and the fly's eye optical systems 22, 23 are arranged and the space A in which the curved mirror 24 and the projection optical system PO are arranged.

(6) The exposure apparatus 100 shown in FIG. 1 is provided with the illumination optical apparatus described above, and the projection optical system P0 which projects, onto the surface (projection surface) of the wafer W, the image of the reflection type master plate which can be arranged on the reticle surface Ra. The projection optical system P0 is arranged in the space C together with the concave mirror 25 among the curved mirror 24 and the concave mirror 25. As a result, the amount of adhesion of the minute particles such as the debris to the reflecting optical member of the projection optical system PO is decreased. The position, at which the light flux from the EUV light source is converged, is located at the boundary portion between the first subchamber 2 (space for accommodating the EUV light source) and the second subchamber 4. The first aperture plate 3 having the small aperture is provided at the position. Therefore, the minute particles such as the debris generated in the first subchamber 2 are suppressed from being moved to the second subchamber 4 (the space B and the space C).

The embodiment described above can be modified as follows.

Figure 4A:
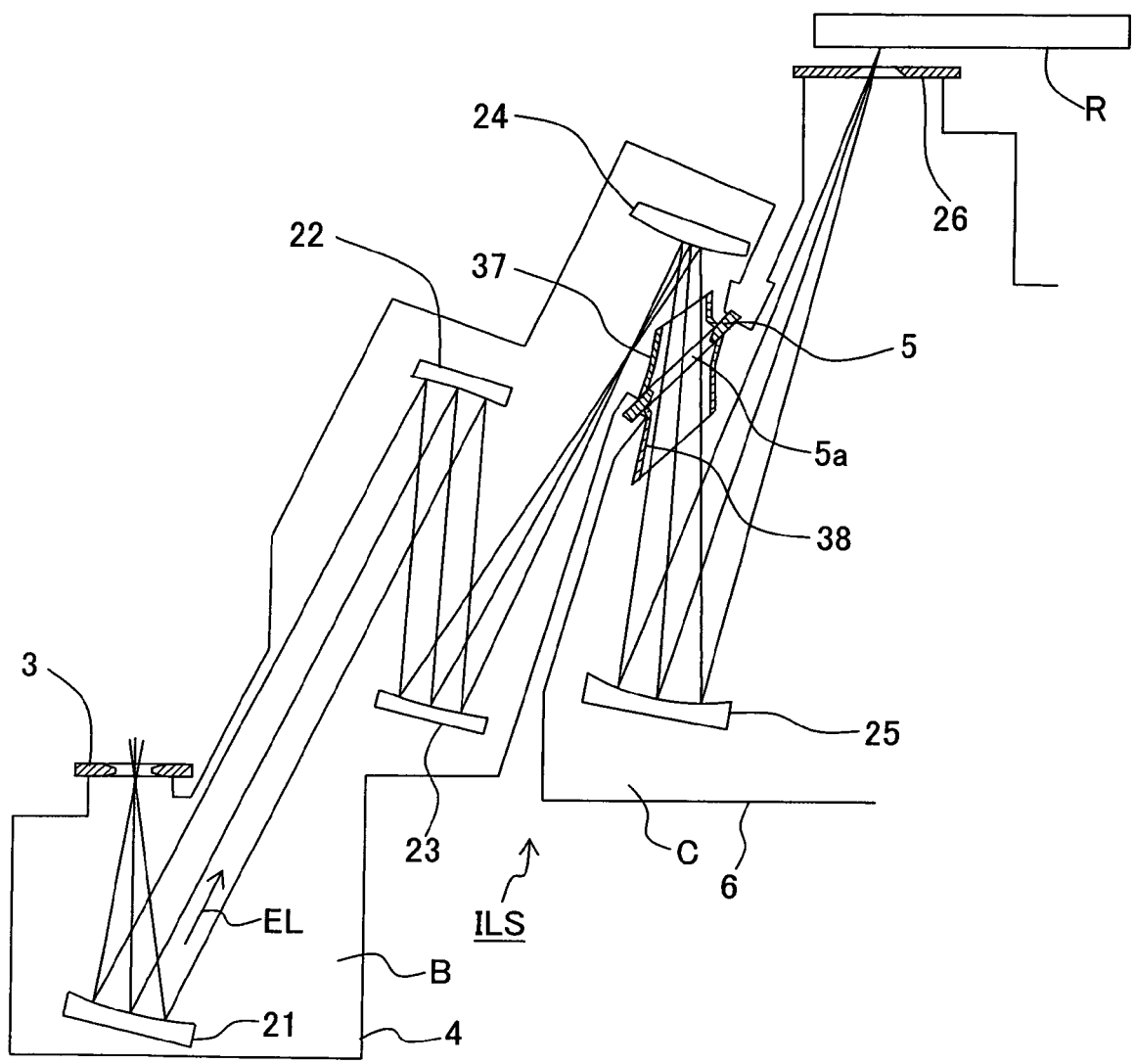
FIG. 4A shows a sectional view of main components of a first modified embodiment of the embodiment of the present invention.

(1) As shown in FIG. 4A in which the components or parts corresponding to those shown in FIG. 1 are designated by the same reference numerals, it is also allowable to provide a cylindrical nozzle member (first member) 37 which surrounds the aperture 5a of the second aperture plate 5 and which surrounds the exposure light EL in the space B in the second subchamber 4, and a cylindrical nozzle member (second member) 38 which surrounds the aperture 5a and which surrounds the exposure light EL in the space C in the third subchamber 6. Owing to the nozzle members (surrounding members) 37, 38 provided as described above, the debris and/or the like in the space B are hardly diffused into the space C. That is, the nozzle members 37, 38 are the cylindrical members which extend, from the second aperture plate 5 respectively, toward the interior of the second subchamber 4 and the interior of the third subchamber 6, respectively, along with the optical path for the exposure light EL. Although not shown in FIG. 3A, the position at which the cross-sectional area of the light flux is smallest (convergent portion of the light flux), the pupil plane of the illumination optical system, the plane conjugate therewith, or the reticle conjugate plane is positioned in the nozzle member 37 or 38. The end portions of the nozzle members 37, 38 (disposed on the sides opposite to the second aperture plate 5) can be regarded as the inlet/outlet ports of the substance (minute particles) and the light of the second subchamber 4 and the third subchamber 6. Therefore, owing to the presence, in each of the nozzle member 37 and 38, of the convergent portion of the reflected light flux from the mirror 24 of the exposure light EL, it is possible to decrease the inner diameters of the nozzle members 37, 38, and thus it is possible to suppress the movement of the minute particles such as the debris between the second subchamber 4 and the third subchamber 6.

It is preferable that the nozzle members 37, 38 are also formed of, for example, molybdenum (Mo) which is a highly heat-resistant material or a molybdenum alloy such as chromium-molybdenum steel.

Even when only one of the nozzle members 37, 38 (especially the nozzle member 37 disposed on the side of the space B) is provided, the effect to suppress the diffusion of the minute particles is also obtained.

Figure 4B:
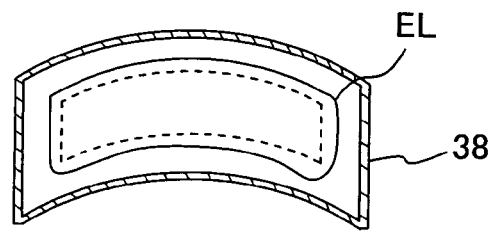
FIG. 4B shows a sectional view of an end portion of a nozzle member 38 shown in FIG. 4A.

In the embodiment described above, the shape of the illumination area of the reticle R is circular arc-shaped. Therefore, as shown in FIG. 4B, the cross-sectional shape of the exposure light EL at a position separated and away from the aperture 5a of the second aperture plate 5 is circular arc-shaped. Accordingly, the shape of the end portion of the nozzle member 38 (as well as the nozzle member 37) may be also circular arc-shaped approximately to the cross-sectional shape of the exposure light EL within a range in which the exposure light EL is not blocked or shielded. Accordingly, it is possible to miniaturize the nozzle member 38 (nozzle member 37).

Figure 5A:
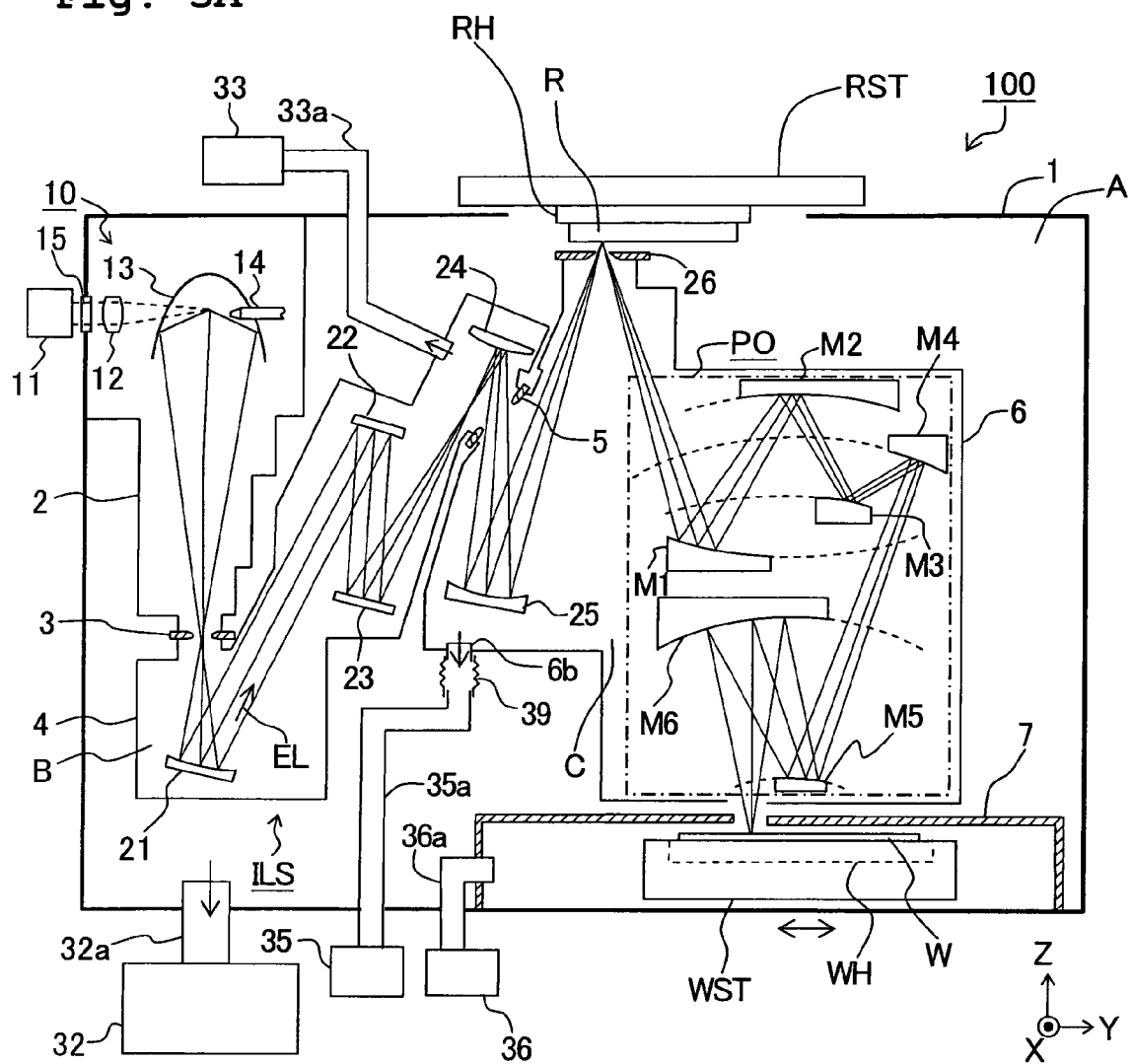
FIG. 5A shows a sectional view of a second modified embodiment of the embodiment of the present invention.

(2) As shown in FIG. 5A in which the components or parts corresponding to those shown in FIG. 1 are designated by the same reference numerals, upon performing the vacuum evacuation by the vacuum pump 35 via the gas discharge tube 35a from the space C in the third subchamber 6, it is allowable to connect the gas discharge tube 35a and the gas discharge port 6b of the third subchamber 6 to each other by a flexible bellows 39. This construction is also applicable to the other vacuum pump 33 in the same manner as described above.

Accordingly, for example, the vibration of the vacuum pump 35 which is constructed of a turbo pump, etc. is not directly transmitted to the third subchamber 6, and the vibration of the projection optical system PO is decreased, thereby improving the resolution and/or the like.

Figure 5B:
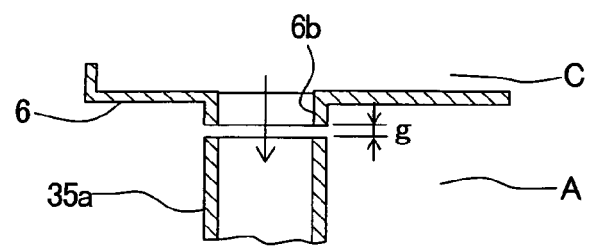
FIG. 5B shows a sectional view of a modified embodiment of a gas discharge tube-connecting mechanism shown in FIG. 5A.

As shown in FIG. 5B, the gas discharge tube 35a and the gas discharge port 6b of the third subchamber 6 may be connected to each other in a non-contact manner, for example, with a small gap g of about 0.1 mm intervening therebetween; and the vacuum evacuation may be performed for the space C of the third subchamber 6 from the gas discharge tube 35a. In this case, the space A around the third subchamber 6 is also in a high degree of vacuum. Therefore, the amount of the gas, allowed to inflow into the space C or the gas discharge tube 35a via the interstice of the gap g from the space A, is extremely small. Therefore, although the efficiency is low to some extent than the construction shown in FIG. 5A, the gas existing in the space C can be discharged in the construction shown in FIG. 5B as well, without transmitting the vibration of the vacuum pump 35 to the third subchamber 6.

(3) In the embodiment described above, the concave mirror 21, the fly's eye optical systems 22, 23, and the curved mirror 24 in the illumination optical system ILS are accommodated in the second subchamber 4. However, only the curved mirror 24 may be accommodated in the second subchamber 4 defining the space B. In this case, the concave mirror 21 and the fly's eye optical systems 22, 23 may be accommodated in one subchamber different from the second subchamber 4 or may be accommodated in a plurality of subchambers different from the second subchamber 4 respectively. Alternatively, it is also allowable that the concave mirror 21 and the fly's eye optical systems 22, 23 are not accommodated in such a subchamber or subchambers.

(4) The first subchamber 2, the second subchamber 4, and the third subchamber 6 may be formed as an integrated chamber. Alternatively, the first subchamber 2, the second subchamber 4, and the third subchamber 6 may be formed separately, and may be connected to one another in an air-tight manner by an appropriate connecting member.

(5) As for the second aperture plate 5 provided at the boundary portion between the second subchamber 4 and the third subchamber 6, it is allowable to make, for example, parts constructing the second aperture plate 5 to be displaceable like a shutter structure so that the size of the aperture 5a can be changed depending on the light flux.

(6) In the embodiments described above, the laser plasma light source is used as the exposure light source. However, there is no limitation to this. It is also allowable to use any one of the SOR (Synchrotron Orbital Radiation) ring, the betatron light source, the discharged light source, the X-ray laser, etc.

(7) The embodiments described above are illustrative of the case in which the EUV light is used as the exposure light, and the projection optical system of the all reflection type constructed of only six mirrors is used. However, this case is described by way of example. The present invention is also applicable, for example, to an exposure apparatus provided with a projection optical system which is constructed of only four mirrors as a matter of course as disclosed in Japanese Patent Application Laid-open No. 11-345761, and an exposure apparatus provided with a projection optical system which has, for example, four to eight mirrors and which uses, as the light source, a VUV light source having a wavelength of 100 to 160 nm, for example, an $Ar_2$ laser (wavelength: 126 nm).

Figure 6:
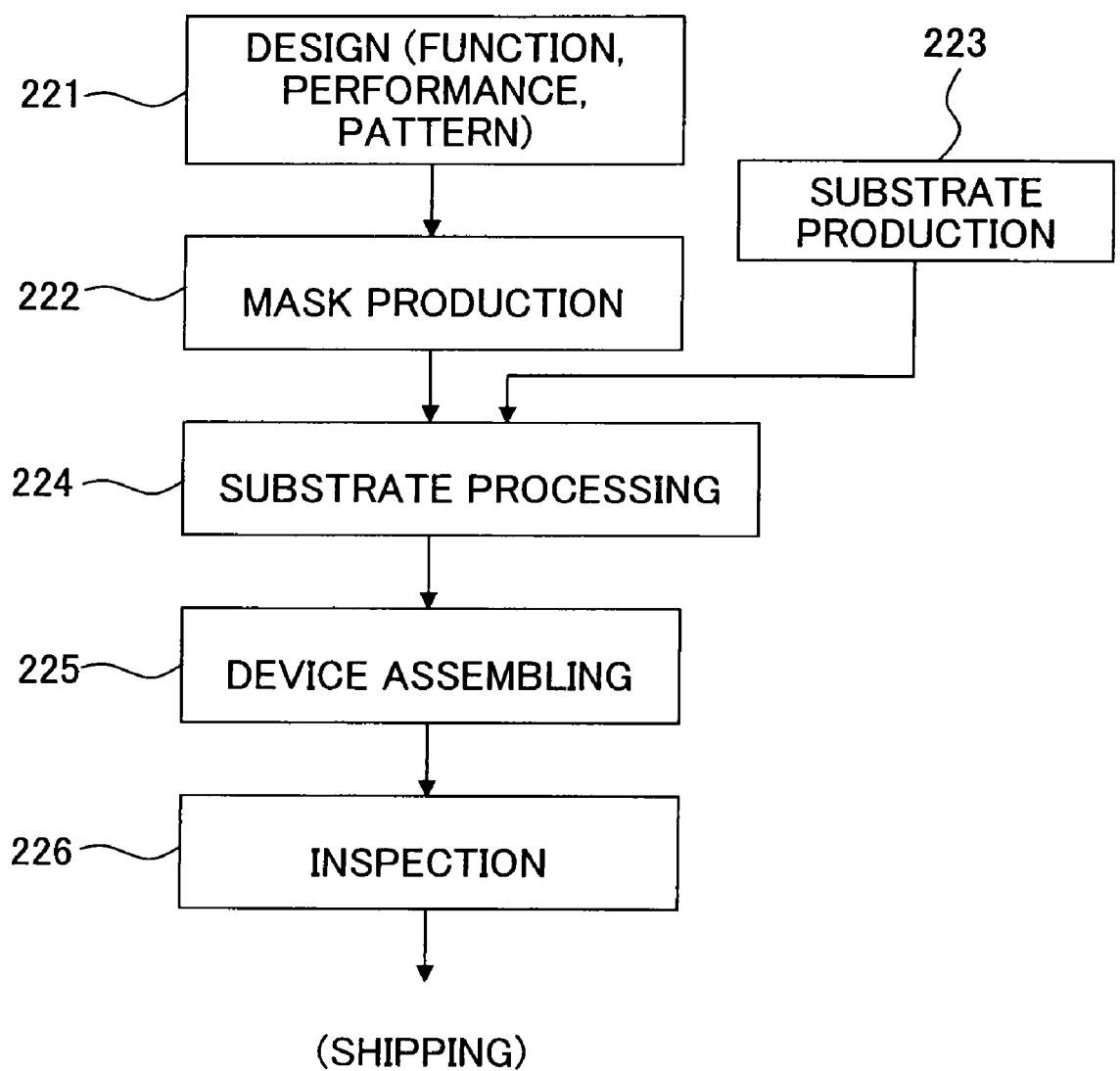
FIG. 6 shows a flow chart of an example of steps of producing a device in the embodiment.

In a case that an electronic device such as a semiconductor device (or a microdevice) is produced by using the exposure apparatus of the embodiment described above, then as shown in FIG. 6, the electronic device is produced by performing a step 221 of designing the function and the performance of the electronic device; a step 222 of manufacturing a mask (reticle) based on the designing step; a step 223 of producing a substrate (wafer) as a base material for the device and coating the substrate (wafer) with the resist; a substrate-processing step 224 including a step of exposing the substrate (photosensitive substrate) with the pattern of the mask by the exposure apparatus (EUV exposure apparatus) of the embodiment described above, a step of developing the exposed substrate, and a step of heating (curing) and etching the developed substrate, etc.; a step 225 of assembling the device (including processing processes such as a dicing step, a bonding step, and a packaging step); an inspection step 226; and the like.

In other words, the method for producing the device includes exposing the substrate (wafer) disposed on the projection surface by using the exposure apparatus of the embodiment described above, and processing the exposed substrate (Step 224). In this procedure, according to the exposure apparatus of the embodiment described above, the debris or the like, which are generated in the laser plasma light source 10, hardly adhere to the mirror of the projection optical system PO, and the reflectance of the projection optical system Po is maintained to be high, thereby making it possible to reduce the maintenance cost for the projection optical system PO, as well as to produce the high-performance device at a high throughput.

The exposure apparatus 100 (EUV exposure apparatus) of the embodiment described above is produced by assembling the various subsystems including the respective constitutive elements such as the illumination optical apparatus (the laser plasma light source 10, the illumination optical system ILS) as defined in claims of this application so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include the mechanical connection, the wiring connection of the electric circuits, the piping connection of the air pressure circuits, etc. in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness, etc. are managed.

According to the illumination optical apparatus and the exposure apparatus including the illumination optical apparatus of the present invention, the debris and/or the like hardly adhere to the mirror of the illumination optical system and/or the like. Therefore, the maintenance cost is reduced for the illumination optical apparatus and the exposure apparatus. Accordingly, the high-performance device can be produced at a high throughput by using the present invention. Therefore, the present invention will remarkably contribute to the international development of the precision mechanical equipment industry including the semiconductor industry.

What is claimed is:

1. A reflection type illumination optical apparatus which guides an illumination light to an illumination objective surface, the illumination optical apparatus comprising:
    an optical system including an optical integrator having a plurality of reflecting mirror elements, a first reflecting surface which reflects the illumination light reflected by each of the plurality of reflecting mirror elements, and a second reflecting surface which guides the illumination light reflected by the first reflecting surface to the illumination objective surface, the optical system defining a position conjugate with the illumination objective surface between the optical integrator and the illumination objective surface; and
    a partition wall member separating a first space in which the first reflecting surface is arranged and a second space in which the second reflecting surface is arranged into mutually different vacuum environments or pressure-reduced environments, the partition wall member having an aperture which is formed in the partition wall member and through which the illumination light passes;
    wherein the aperture of the partition wall member is arranged at a position at which a cross-sectional area of a light flux of the illumination light reflected by the first reflecting surface is smallest, or the aperture is arranged in the vicinity of the position.

2. The illumination optical apparatus according to claim 1, wherein the position, at which the cross-sectional area of the light flux of the illumination light is smallest, is a position conjugate with the illumination objective surface, a position of a pupil plane of the optical system, or a position conjugate with the pupil plane.

3. The illumination optical apparatus according to claim 2, wherein the partition wall member is arranged at the pupil plane of the optical system, a plane conjugate with the pupil plane, or in the vicinity of the planes; and
    the aperture of the partition wall member functions as an aperture diaphragm of the optical system.

4. The illumination optical apparatus according to claim 1, further comprising a gas discharge mechanism which discharges a gas from the first space and the second space,
    wherein a gas discharge port of the gas discharge mechanism is provided on the partition wall member or in the vicinity of the partition wall member.

5. The illumination optical apparatus according to claim 4, wherein the gas discharge mechanism has a first gas discharge mechanism which has a gas discharge port provided on a side of the first space of the partition wall member, and a second gas discharge mechanism which has a gas discharge port provided on a side of the second space of the partition wall member.

6. The illumination optical apparatus according to claim 5, wherein the gas discharge port, which is provided on the side of the second space, is connected to the second gas discharge mechanism by a flexible member.

7. The illumination optical apparatus according to claim 5, wherein the gas discharge port, which is provided on the side of the second space, is connected to the second gas discharge mechanism with a gap intervening between the gas discharge port and the second gas discharge mechanism.

8. The illumination optical apparatus according to claim 4, wherein the gas discharge mechanism evacuates the first space and the second space so that a pressure in the first space is lower than a pressure in the second space.

9. The illumination optical apparatus according to claim 1, further comprising a surrounding member which surrounds the aperture of the partition wall member and which surrounds the light flux of the illumination light.

10. The illumination optical apparatus according to claim 9, wherein the surrounding member has a first member which surrounds the aperture of the partition wall member on a side of the first space, and a second member which surrounds the aperture of the partition wall member on a side of the second space.

11. The illumination optical apparatus according to claim 10, wherein the position, at which the cross-sectional area is smallest, is located within the aperture of the partition wall member, the first member, or the second member.

12. The illumination optical apparatus according to claim 1, wherein the partition wall member is formed of molybdenum or alloy thereof.

13. The illumination optical apparatus according to claim 1, wherein the optical system includes a plurality of reflecting optical members; and
the reflecting optical members are arranged between a light source which emits the illumination light and the first reflecting surface, and the reflecting optical members are arranged in the first space together with the optical integrator and the first reflecting surface.

14. The illumination optical apparatus according to claim 1, wherein the optical system includes a plurality of reflecting optical members;
the second reflecting surface is formed on a reflecting optical member, among the plurality of reflecting optical members, which is arranged at a position closest to the illumination objective surface; and
a shape of the second reflecting surface is concave.

15. An exposure apparatus comprising:
the illumination optical apparatus as defined in claim 1; and
a projection optical system which projects, onto a projection surface, an image of a reflection type master plate arrangeable on the illumination objective surface;
wherein the projection optical system is arranged in the second space together with the second reflecting surface.

16. The exposure apparatus according to claim 15, further comprising an EUV light source.

17. The exposure apparatus according to claim 16, further comprising another partition wall member which separates the first space from a space accommodating the EUV light source, wherein a light flux from the EUV light source is converged at an aperture of the another partition wall member.

18. A method for producing a device, comprising:
exposing a substrate disposed on a projection surface by using the exposure apparatus as defined in claim 15; and
processing the exposed substrate.

* * * * *

(12) INTER PARTES REEXAMINATION CERTIFICATE (630th)
United States Patent
Nishikawa

(10) Number: US 7,719,661 C1
(45) Certificate Issued: Jun. 28, 2013

(54) ILLUMINATION OPTICAL APPARATUS, EXPOSURE APPARATUS, AND METHOD FOR PRODUCING DEVICE

(75) Inventor: Jin Nishikawa, Tokyo (JP)

(73) Assignee: Nikon Corporation, Chiyoda-Ku, Tokyo (JP)

Reexamination Request:
No. 95/001,770, Sep. 23, 2011

Reexamination Certificate for:
Patent No.: 7,719,661
Issued: May 18, 2010
Appl. No.: 12/292,381
Filed: Nov. 18, 2008

Related U.S. Application Data

(60) Provisional application No. 60/996,614, filed on Nov. 27, 2007.

(51) Int. Cl.
*G03B 27/54* (2006.01)
*G03B 27/52* (2006.01)
*G03F 7/20* (2006.01)

(52) U.S. Cl.
CPC .......... *G03F 7/70075* (2013.01); *G03F 7/702* (2013.01); *G03F 7/70841* (2013.01); *G03F 7/70908* (2013.01); *G03F 7/70916* (2013.01)

USPC ............................................. 355/67; 355/30

(58) Field of Classification Search
None
See application file for complete search history.

(56) References Cited

To view the complete listing of prior art documents cited during the proceeding for Reexamination Control Number 95/001,770, please refer to the USPTO's public Patent Application Information Retrieval (PAIR) system under the Display References tab.

*Primary Examiner* — Albert J Gagliardi

(57) ABSTRACT

An illumination optical apparatus which illuminates an illumination objective surface with an exposure light includes: an illumination optical system having a curved mirror and a concave mirror and defining a position substantially conjugate with the illumination objective surface between the curved and concave mirrors; and a second aperture plate separating a space in which the curved mirror is arranged and a space in which the concave mirror is arranged into mutually different vacuum environments or pressure-reduced environments, and having an aperture through which the exposure light passes, the aperture being arranged at a position at which a cross-sectional area of the exposure light is smallest, or in the vicinity of the position. It is possible to decrease the amount of passage of minute particles such as debris in relation to any downstream-side optical system.

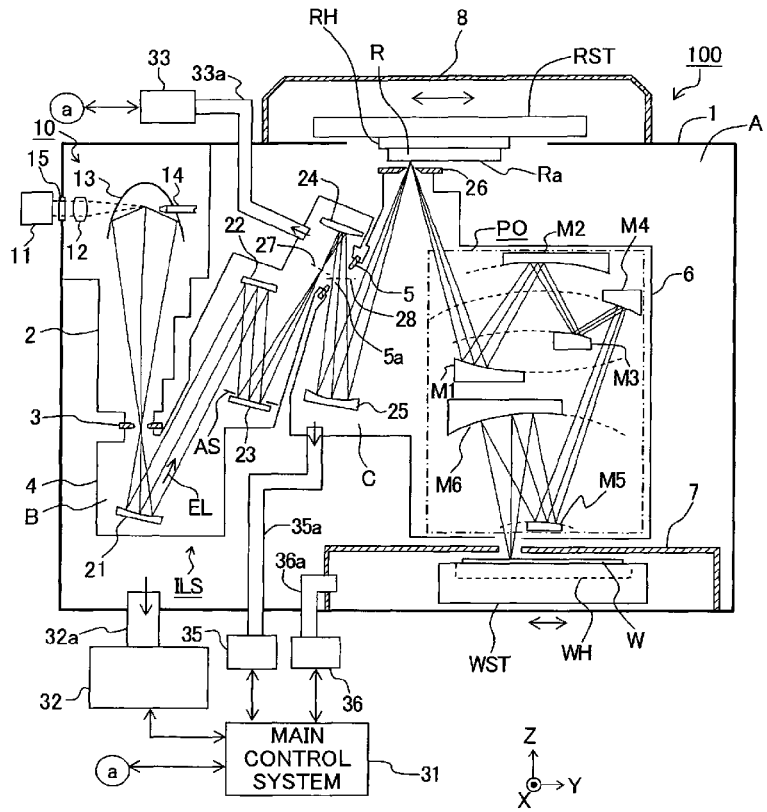

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2 and 3 are cancelled.

Claims 1 and 8 are determined to be patentable as amended.

Claims 4-7 and 9-18, dependent on an amended claim, are determined to be patentable.

New claims 19 and 20 are added and determined to be patentable.

1. A reflection type illumination optical apparatus which guides an illumination light to an illumination objective surface, the illumination optical apparatus comprising:

an optical system including an optical integrator having a plurality of reflecting mirror elements, a first reflecting surface which reflects the illumination light reflected by each of the plurality of reflecting mirror elements, and a second reflecting surface which guides the illumination light reflected by the first reflecting surface to the illumination objective surface, [the optical system] *the first and second reflecting surfaces* defining a position conjugate with the illumination objective surface between the optical integrator and the [illumination objective] *first reflecting* surface; and a partition wall member separating a first space in which the first reflecting surface is arranged and a second space in which the second reflecting surface is arranged into mutually different vacuum environments or pressure-reduced environments, the partition wall member having an aperture which is formed in the partition wall member and through which the illumination light passes;

wherein the aperture of the partition wall member is arranged at a position at which a cross-sectional area of a light flux of the illumination light reflected by the first reflecting surface is smallest, or the aperture is arranged in the vicinity of the position.

8. The illumination optical apparatus according to claim 4, [wherein] *further comprising a controller which is configured to control* the gas discharge mechanism [evacuates] *to evacuate* the first space and the second space so that a pressure in the first space is lower than a pressure in the second space.

*19. The Illumination optical apparatus according to claim 1, wherein reflected lights, of the illumination light, reflected by the plurality of reflecting mirror elements respectively, are reflected by the first reflecting surface and then are converged at the position at which the cross-sectional area of the light flux of the illumination light reflected by the first reflecting surface is smallest.*

*20. The illumination optical apparatus according to claim 4, wherein the gas discharge port is provided adjacent to the aperture of the partition wall member.*

\* \* \* \* \*